(12) United States Patent
Fink

(10) Patent No.: US 7,034,333 B1
(45) Date of Patent: Apr. 25, 2006

(54) SEMICONDUCTOR SENSOR, COMPRISING A PIXEL STRUCTURE AND THE USE OF SAID SENSOR IN A VACUUM SYSTEM

(76) Inventor: Lutz Fink, Schmiedestrasse 2, D-21698 Issendorf (DE)

( * ) Notice: Subject to any disclaimer, the term of this patent is extended or adjusted under 35 U.S.C. 154(b) by 535 days.

(21) Appl. No.: 10/018,098

(22) PCT Filed: Jun. 13, 2000

(86) PCT No.: PCT/DE00/01934

§ 371 (c)(1),
(2), (4) Date: Dec. 11, 2001

(87) PCT Pub. No.: WO00/79594

PCT Pub. Date: Dec. 28, 2000

(30) Foreign Application Priority Data

Jun. 17, 1999  (DE) ................................ 199 27 694

(51) Int. Cl.
| H01L 21/4403 | (2006.01) |
| H01L 21/4404 | (2006.01) |
| H01L 31/00 | (2006.01) |
| G21K 4/00 | (2006.01) |

(52) U.S. Cl. ........................... 257/48; 257/53; 257/59; 250/580; 250/591; 250/370.09; 313/366; 313/367

(58) Field of Classification Search ................ 257/48, 257/53, 59, E27.13; 250/580, 591, 370.09; 313/366, 367; 357/31
See application file for complete search history.

(56) References Cited

U.S. PATENT DOCUMENTS 3,902,095 A * 8/1975 Bierig et al. ................ 313/367
4,789,888 A   12/1988 Miyata et al.
5,132,541 A   7/1992 Conrads et al.
5,311,038 A * 5/1994 Yamamoto et al. .......... 257/40
5,365,056 A   11/1994 Sklebitz et al.
5,396,072 A * 3/1995 Schiebel et al. ......... 250/370.09
5,598,004 A * 1/1997 Powell et al. .......... 250/370.09
5,729,021 A * 3/1998 Brauers et al. ......... 250/370.09
5,733,804 A * 3/1998 Hack et al. ................. 438/158
5,812,109 A * 9/1998 Kaifu et al. ................. 345/104
5,877,594 A   3/1999 Miyano et al.
6,021,173 A * 2/2000 Brauers et al. ............. 378/98.8
6,034,725 A * 3/2000 Franklin et al. ............. 348/310
6,169,286 B1 * 1/2001 Singh ..................... 250/370.08
6,172,369 B1 * 1/2001 Waechter et al. ....... 250/370.09
6,232,606 B1 * 5/2001 Singh ..................... 250/370.09
6,359,672 B1 * 3/2002 Gu et al. ..................... 349/138

FOREIGN PATENT DOCUMENTS

| JP | 02 94566 | 4/1990 |
| JP | 06 310 699 | 11/1994 |

\* cited by examiner

Primary Examiner—Hoai Pham
Assistant Examiner—Shrinivas H. Rao
(74) Attorney, Agent, or Firm—Saliwanchik, Lloyd & Saliwanchik

(57) ABSTRACT

A semiconductor sensor for direct detection of electrons has a pixel structure in which a capacitance is designed to each pixel that stores a charge and converts the charge into a readable voltage. A conductive layer substantially covers the pixel structure. The conductive layer includes pixel surface coatings, each of which cover an individual pixel. Each pixel surface coating is separated from each adjoining pixel surface coating by a gap. A second conductive layer covers a surface of the gap. An insulation insulates the pixel surface coating from the second conductive layer. The conductive layers may be metal or other conductive, light impervious materials. The second conductive layer may include a capacitor electrode.

11 Claims, 2 Drawing Sheets

US 7,034,333 B1

SEMICONDUCTOR SENSOR, COMPRISING A PIXEL STRUCTURE AND THE USE OF SAID SENSOR IN A VACUUM SYSTEM

CROSS REFERENCE TO RELATED APPLICATIONS

Applicant claims priority under 35 U.S.C. §119 of German Application No. 199 27 694.3 filed Jun. 17, 1999. Applicant also claims priority under 35 U.S.C. §365 of PCT/DE00/01934 filed Jun. 13, 2000. The international application under PCT article 21(2) was not published in English.

BACKGROUND OF THE INVENTION

1. Field of the Invention

The invention is a semiconductor sensor with pixel structure, containing a capacity for each pixel which stores charge and converts it into voltage that can be read out. The pixel structure is in the main completely covered with a conductive layer. Furthermore the invention is about the sensor's use integrated in a vacuum system (IC) with photo cathode. The semiconductor is ideal for image processing in opto-electronic applications.

2. Prior Art

Opto-electronic image converters are known in semiconductor technology. With the so-called CCD-device electrons are removed from the lattice structure by the incidence of photons on the sensor surface, which are then stored in so-called pixel cells at the conversion place and can be read out afterwards in different ways. Moreover active-pixel-sensors (APS) are known, where each pixel is connected with at least one transistor that converts or decouples the pixel information for direct read out at inquiry.

A disadvantage, however, is that the known image converters react sensible against electrons that striking the sensor surface. The kinetic energy of the electrons influences the crystalline semiconductor structure, so that the system is forced open under operation with the result of pixel defects, which show for example in dark currents. Therefore it does not make sense to integrate such a semiconductor element into an image intensifier tube, to, for example, convert the information directly into a video signal.

A pixel structure covered by a conductive layer is known from the EP 0 588 397 A2 in the form of an x-ray image detector. The conductive layer serves as a pre-voltage electrode, in order to lead charges that are generated in a photo conductor layer, under influence of a by this electrode produced electric field, to each individual gathering electrode of the pixels. Similar semiconductor image sensors are known for example from the EP 0 444 702 A1, the patent abstract of Japan JP 06310699 A, 1994, JPO, the U.S. Pat. No. 4,789,888 and the U.S. Pat. No. 5,311,038 in the form of light- and/or x-ray sensible sensors. From the two last-mentioned files it is known in addition to cover gaps, in order to avoid the unwelcome influence of incident light.

From the U.S. Pat. No. 3,902,095 an electron beam semiconductor intensifier with shielded diode junctions is known, which is designed as electron beam semiconductor tube, for example as transmitter amplifier, switching tube or as driving circuit for other high-voltage intensifier tubes, like for example traveling-wave power tubes for radar transmitters. The semiconductor is partially covered with a conductive coating, the shielding having openings above a segment of the diode junction. Here the electrons are to strike well-aimed, the screening preventing unwelcome electron bombardment in the periphery areas of the device (diode). By this unwelcome surface- and bulk charging effects are eliminated. Therefore the maximum reverse bias voltage is increased and hence the maximum possible output power of tubes employing such diodes is increased, too. The interconnection of a plurality of such diodes causes an increase of the intensifier's efficiency, the capacitance being reduced in proportion to the exposed surface. Nevertheless the semiconductor tube is neither designed nor suited for an image transmitting detection.

Moreover from the patent abstracts of Japan: JP 2-94566 A E-944, 1990, Vol. 14/No. 292 a semiconductor with pixel electrodes with a further, at least gap-covering layer is known. But this is an optical semiconductor sensor, at which multiple reflections on the inside of the optical covering (layer are reduced or eliminated by a reflection avoiding film.

Besides, from the DE 42 23 693 A1 an x-ray image intensifier together with a vacuum housing, an input illumination screen, an electron optic and an image sensor, which is located on the side of the vacuum housing that is opposite to the input illumination screen, is known, where the from a photo cathode resulting electrons are converted directly into a video signal in a CCD-image converter. At this, the image sensor contains a layer system, which has at least one semiconductor layer that initiates an electron conversion and is of amorphous semiconductor material. This publication therefore shows a concrete different solution of the following problem.

SUMMARY OF THE INVENTION

Based on the EP 0 588 397 A2 it is the task of the invention to describe a semiconductor sensor with a pixel structure that detects electrons and whose semiconductor structure is protected from electron bombardment.

This task is solved by a semiconductor sensor according to an embodiment of the invention.

The covering of the pixel surface with a conductive layer permits the capture of the incident electrons, that are stored as charge and are converted into voltage and read out in a for semiconductor image sensors conventional way. The conductive cover acts as electrode for the incident electrons, the electrode being part of a capacity and therefore serving for charge storage. The essential is that the electron-sensible pixel surface and the semiconductor structures which lie beneath are screened by the conductive layer. The incident electrons by this are processed separately as measuring signal for the particular struck pixel.

The electrons that strike the coating are therefore caught pixel orientated and prevented from penetrating into the semiconductor structure and from there causing dark currents, faulty pixels, failure of lines and columns, or the like defects.

As the surface of gaps between the pixels is covered with a second conductive layer, the second conductive layer being insulated from the pixel surface coatings, the gaps between the pixels are also protected against the unwelcome entry of electrons into the semiconductor layer. This from the pixel surface coatings insulated second layer can by application of a potential be used for field modification, for example as acceleration potential.

The layers preferentially consist of a conductive, light-impervious material, for example metal. Incident electrons are absorbed by the conductive material and led to the semiconductor structure. The light-impervious material prevents hazardous photons from penetrating the sensor surface, and undesirable signals are thus avoided. The layers preferentially consist of aluminum, as this material is easy to apply, and has a good conductivity and light-imperviousness. Depending on the design of the semiconductor, the second conductive layer that covers the gaps, can be used as capacitor electrode. Moreover a potential for the acceleration of the incident electron current can be applied to the second conductive layer.

If the sensor's detection surface is provided with a electron-intensifying material and the channels to the pixel surfaces are given, an electron multiplication right in front of the sensor surfaces is achieved. The openings in the coating allow the electrons to pass unhindered to the sensor surface and electrons that strike the sides of the openings only lead to an electron multiplication and a signal intensification.

Due to the fact that the electron-intensifying coating on the upper- and lower side is each covered with a conductive thin layer to which an electric potential is applied, the desired electron flow is guaranteed and an acceleration voltage is applied by the layer thickness of the electron-intensifying coating.

If neighboring pixel surfaces have different potential, a charge binning of the electrons that strike the sensor surface on particular, pre-selected pixels can be generated. Such a charge binning, the so-called 'Binning', can for example be used for a preliminarily reduced resolution with a higher detection ratio.

In the semiconductor used according to an embodiment of the invention, an image sensor is given with which photons are at first converted into electrons in a vacuum system and these electrons are than directly converted into an image-giving voltage signal (video signal). The semiconductor does not show pixel defects at the desired bombardment of electrons, therefore a totally image-oriented conversion of the at the beginning striking optical signal into a electric signal, for example for the display on a video monitor, takes place.

It is best to generate the intensification in the image intensifier tube with one or more multi-channel plates. The multi-channel plates are responsible for the intensification of the image information.

BRIEF DESCRIPTION OF THE DRAWINGS

In the following a design example of the invention is described in detail by means of the attached drawing.

In this shows.

DETAILED DESCRIPTION OF THE INVENTION

Figure 1:
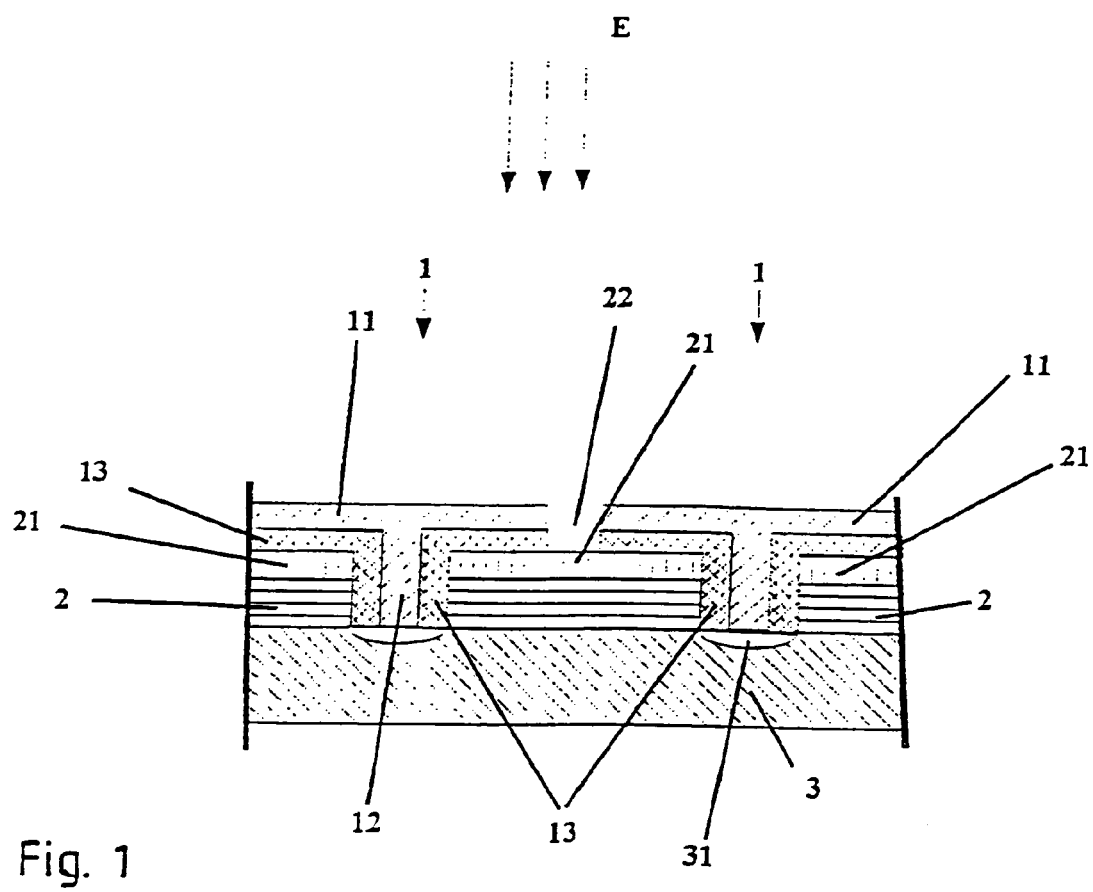
FIG. 1 a schematic sectional view of a semiconductor according to invention in detail.

In FIG. 1 a part of a semiconductor sensor with two pixels is shown. On the sensor's surface that shows into the direction of the electron flow which is to be detected, in FIG. 1 above, conductive layers, which are assigned to the pixel structure 1, are assembled as active pixel surfaces 11, that preferably consist of aluminum. This conductive layer 11 is through-connected to a semiconductor element 3.

The semiconductor element 3 also has a pixel structure 1, which reproduces an assigned circuit for each pixel surface 11 that consists of conductive material. Besides the not shown semiconductor element 3 can be designed as active-pixel-structure. Between the conductive layer 11 of each pixel and the semiconductor element 3 an insulation 13 is planned with the exception of contact 12.

The insulation 13 separates the sensor surface 11 which is contacted 12 to the semiconductor element 1 from a second conductive layer 21 which screens the gaps between the pixel surfaces 11 in such a way that here striking electrons are prevented from reaching the semiconductor structure below and from causing mistakes. The second conductive layer 21 in the example is applied to a passivation layer 2 which is applied to the upper side of the semiconductor element 3 together with recesses for the insulated connections 12, 13.

In the following the operation of the semiconductor sensor is explained.

The electron flow E, that is to be detected, strikes the conductive layer 11. Each pixel-orientated registered electron is by some sort of capacitor electrode led from the active pixel surfaces 11 to the semiconductor element 3, in order to convert charge into voltage. Due to the semiconductor's design it is possible to use the second conductive layer 21 as capacitor electrode, too. Moreover it is also possible to here apply a voltage to accelerate the incident electron flow E. The conductive layer 11 of each pixel is designed as electrode to a 'floating diffusion' 31 or 'floating gate' for charge conversion.

Figure 2:
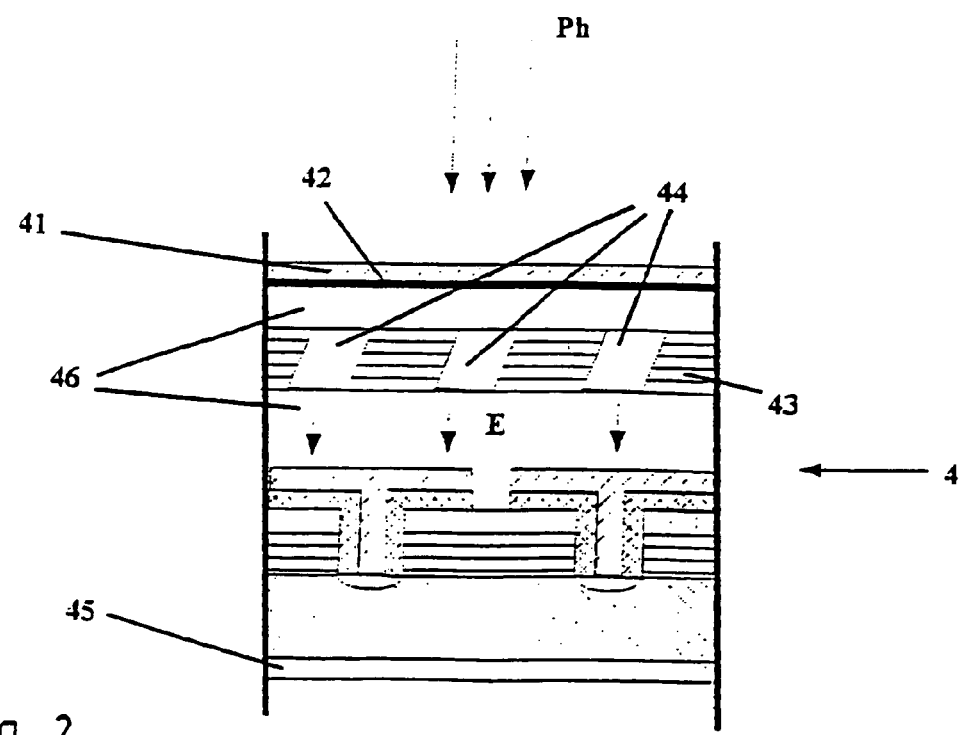
FIG. 2 a diagram of an assembly for imaging with such a semiconductor in a vacuum system with photo cathode and FIG. 3 a schematic sectional view of a semiconductor sensor in another assembly example.

FIG. 2 shows a preferred combination of the semiconductor sensor in detail similar to the design according to FIG. 1 in a vacuum system 4 in schematic sectional view. The vacuum system 4 has an input window 41 with a photo cathode 42. In the vacuum area 46 of the device 4 at least on multi-channel-plate 43 with a variety of channels 44 is planned.

Unlike conventional image converter—respectively image intensifier tubes no illumination screen for the conversion of the electron flow E into visible light is necessary at the output window 45, but directly arranged within the vacuum system of the semiconductor sensor according to the design of FIG. 1. Here the direction of the pixel structure 1 causes that the signal information from the channels 44 of the multi-channel-plate 43 exactly strikes the conductive layers 11 of the pixels. Therefore an image-orientated processing of the image information which was taken at the photo cathode 42 is possible. The output window 45 is arranged as termination element for the vacuum area 46 on the backside of the semiconductor element 3. In this termination element 45 the connection of the semiconductor structure can be led outside.

In the following the way of operation of the image processing lay out will be explained:

Optical image information in the shape of a photon current Ph reach the photo cathode 42 of the vacuum system (VA-MOS) 4 through the input window 41. There electrons are emitted from the photo cathode material by the incident photons. In order to intensify the from the photo cathode emitted electron flow E the electrons are accelerated by a electric field at the multi-channel-plate. The resulting electron flow reaches the pixel surfaces 11 of the semiconductor sensor with its pixel structure 1 through the channels 44 of the multi-channel-plate. Below the semiconductor the vacuum area 46 of the system 4 is closed with a termination element 45 which for example is designed as ceramic plane with through-connections for the semiconductor sensor.

The operation of the semiconductor sensor corresponds to that described in the assembly example according to FIG. 1.

There the electron flow E is directly converted from the semiconductor sensor into an electric signal. By the help of this structure a received image can therefore be converted in a post signal processing on the semiconductor element or extern, for example in a video signal.

Figure 3:
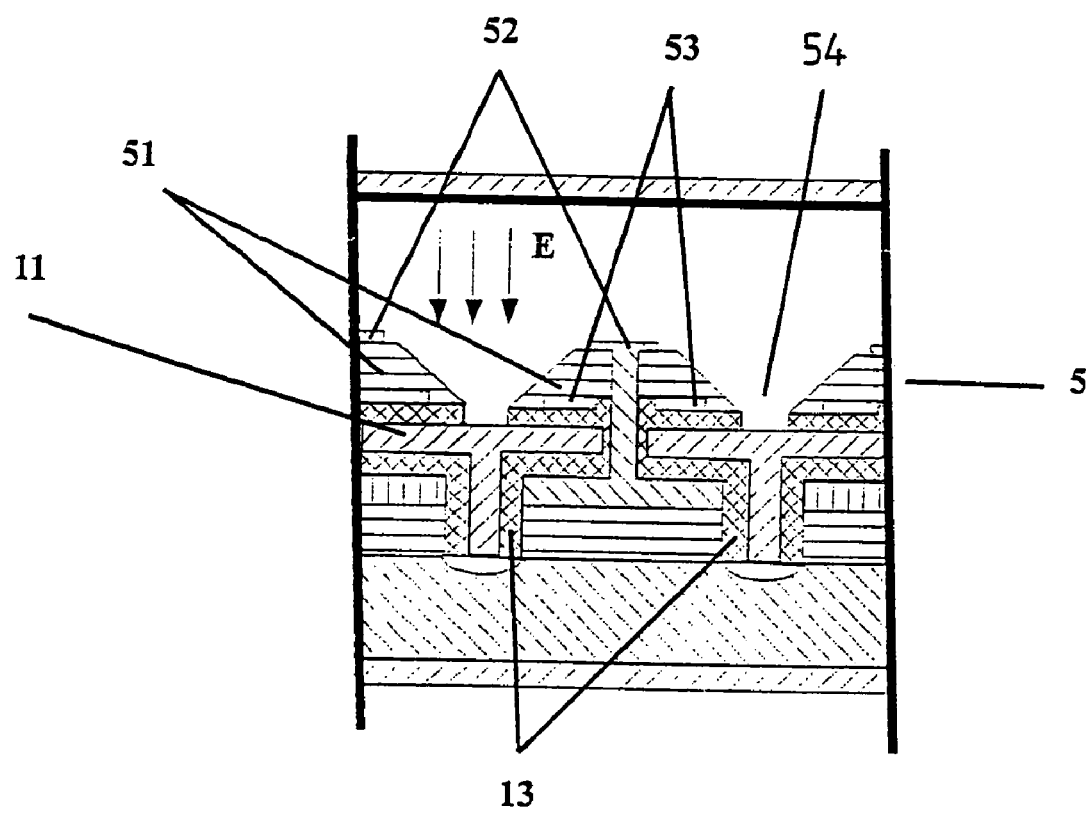

In FIG. 3 a semiconductor sensor according to FIG. 1 is shown, on whose sensor surface an electron-intensifying coating 5 is planned. The coating in the main consists of an electron-intensifying material 51, for example alpha-silicon. To achieve a corresponding electron intensification in this material the coating 5 has a upper and a lower thin layer 52,53 which consist of conductive material. For the contact surface between the lower thin layer 53 and the pixel surface 11 a insulation is planned, for example the insulation 13. To lead the electrons to the pixel surfaces 11 transit channels 54 in the coating 5 are planned. These transit channels 54 are preferably pixel-orientated assembled.

It must be emphasized that the invented semiconductor sensor is able to convert an electron flow E direct, without preliminary conversion into light signals, and pixel-orientated into an electric signal. Therefore there is no danger of pixel damage like in conventional image sensors.

REFERENCE LIST 1 pixel structure
11 pixel surface, conductive layer
12 connection
13 insulation
2 passivation layer
21 second conductive layer
22 gap
3 semiconductor
31 floating diffusion
4 vacuum tube
41 input window
42 photo cathode
43 multi-channel-plate (MCP)
44 channel
45 output window or termination element
46 vacuum area
5 electron-intensifying coating (secondary electron emitting coating)
51 electron-intensifying material (alpha-silicon)
52 upper thin layer
53 lower thin layer
54 transit channel
E electrons
Ph photons

What is claimed is:

1. A semiconductor sensor, comprising:
a semiconductor layer having a top surface;
a plurality of pixel surface coatings positioned above the top surface of the semiconductor layer to form a corresponding plurality of pixels, wherein each pixel surface coating is separated from each adjacent pixel surface coating, wherein the plurality of pixel surface coatings are conductive, wherein electrons incident one of the plurality of pixel surface coatings are absorbed by the one of the plurality of pixel surface coatings resulting in a charge associated with the pixel corresponding to the one of the plurality of pixel surface coatings such that the charge produces a readable voltage associated with the pixel corresponding to the one of the plurality of pixel surface coatings; and
a conductive layer positioned above the top surface of the semiconductor layer and positioned so that electrons passing between adjacent pixel surface coatings are incident on the conductive layer and prevented from penetrating into the semiconductor layer, wherein the conductive layer is insulated from the plurality of pixel surface coatings.

2. The semiconductor sensor according to claims 1, wherein each of the plurality of pixel surface coatings comprises light impervious material wherein each of the plurality of pixel surface coatings are light impervious.

3. The semiconductor sensor according to claim 2, wherein each of the plurality of pixel surface coatings comprises aluminum.

4. The semiconductor sensor according to claims 1, wherein the conductive layer acts as a capacitor electrode.

5. The semiconductor sensor according to claims 1, wherein a potential is applied to the conductive layer.

6. The semiconductor sensor according to claim 1, further comprising a plurality of detection surfaces positioned above the plurality of pixel surface coatings, each detection surface corresponding to one of the plurality of pixel surface coatings wherein each detection surface comprises an electron-intensifying coating, wherein electron multiplication occurs when an electron is incident on the electron-intensifying coating.

7. The semiconductor sensor according to claim 6, further comprising a plurality of second conductive layers wherein each of the plurality of second conductive layers is positioned above a corresponding pixel surface coating and below a corresponding electron-intensifying coating wherein a first additional electric potential is applied to each of the plurality of second conductive layers wherein the conductive layer comprises at least one extension positioned above the plurality of detection surfaces, wherein a second additional electric potential is applied to each of the at least one extension.

8. The semiconductor according to claim 1, wherein neighboring pixel surfaces coatings have different electric potentials.

9. The semiconductor sensor according to claim 1, wherein the conductive layer comprises a light impervious material, wherein the conductive layer is light impervious.

10. The semiconductor sensor according to claim 9, wherein the second conductive layer comprises aluminum.

11. The semiconductor sensor according to claim 6, wherein each detection surface comprises a transmit channel which allows electrons to pass through the transmit channel to the corresponding pixel surface coating.

* * * * *